United States Patent
Dina et al.

(10) Patent No.: US 10,530,186 B2
(45) Date of Patent: Jan. 7, 2020

(54) WIRELESS POWER TRANSMISSION WITH FRACTIONAL TIMING RESOLUTION

(71) Applicant: Texas Instruments Incorporated, Dallas, TX (US)

(72) Inventors: Marius Vicentiu Dina, Grove Heights, MN (US); Salman Mazhar, Frisco, TX (US); Jingwei Xu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 225 days.

(21) Appl. No.: 15/674,360

(22) Filed: Aug. 10, 2017

(65) Prior Publication Data

US 2019/0052123 A1 Feb. 14, 2019

(51) Int. Cl.
| | |
|---|---|
| *G06F 1/00* | (2006.01) |
| *H02J 50/10* | (2016.01) |
| *G06F 1/26* | (2006.01) |
| *G06F 1/324* | (2019.01) |
| *H02M 3/335* | (2006.01) |
| *H03L 7/099* | (2006.01) |
| *H02J 7/02* | (2016.01) |

(52) U.S. Cl.
CPC ............ *H02J 50/10* (2016.02); *G06F 1/266* (2013.01); *G06F 1/324* (2013.01); *H02M 3/33507* (2013.01); *H03L 7/099* (2013.01); *H02J 7/025* (2013.01)

(58) Field of Classification Search
CPC ...................................................... H02J 50/10
See application file for complete search history.

(56) References Cited

U.S. PATENT DOCUMENTS

| | | | |
|---|---|---|---|
| 5,657,211 A | 8/1997 | Brockmann | |
| 2012/0249506 A1* | 10/2012 | Jeong ................. | G02F 1/13306 345/211 |
| 2014/0191815 A1* | 7/2014 | Mirzaei .................. | H03L 7/085 331/1 A |
| 2014/0225458 A1* | 8/2014 | Rehm .................... | H02J 5/005 307/149 |
| 2016/0049826 A1* | 2/2016 | Lee ........................ | H02J 7/025 320/108 |
| 2016/0197494 A1* | 7/2016 | Kwon ................. | H04B 5/0037 307/104 |
| 2016/0336783 A1* | 11/2016 | Hsia ....................... | H02J 50/12 |
| 2017/0229923 A1* | 8/2017 | Shimokawa ........... | H02J 50/12 |
| 2018/0084406 A1* | 3/2018 | Tandai ................... | H04W 8/24 |
| 2018/0090993 A1* | 3/2018 | Markhi ............. | H02M 3/33592 |

FOREIGN PATENT DOCUMENTS

| | | |
|---|---|---|
| EP | 2454799 A2 | 5/2012 |
| EP | 2873132 B1 | 6/2013 |
| WO | 2011007300 A2 | 1/2011 |
| WO | 2017091312 A1 | 6/2017 |

OTHER PUBLICATIONS

International Search report dated Dec. 6, 2018.

* cited by examiner

*Primary Examiner* — Mohammed H Rehman
(74) *Attorney, Agent, or Firm* — Lawrence J. Bassuk; Charles A. Brill; Frank D. Cimino

(57) ABSTRACT

Systems and methods for wireless power transfer with fractional timing resolution are described. In some embodiments, an electrical power transmitter may include a transistor and a rising edge control circuit configured to control a gate of the transistor to produce a rising edge of a pulse at a time selected with a resolution greater than a full-clock period.

14 Claims, 4 Drawing Sheets

WIRELESS POWER TRANSMISSION WITH FRACTIONAL TIMING RESOLUTION

BACKGROUND

A wireless power transmission system has a radio-frequency (RF) transmitter and an RF receiver. The RF transmitter is coupled to a source of electrical power (e.g., a mains power line), and it converts an electrical current into an oscillating electromagnetic field using an inductor, coil, antenna, metal plate, or other coupling device. Another coupling device at the RF receiver captures a portion of the radiated electromagnetic field (the two coils in proximity to each other form an electrical transformer), and the RF receiver then converts the received electromagnetic field back into an electrical current.

In many implementations, the RF transmitter may be disposed within a charging pad or station, and the RF receiver may be coupled to a computing device (e.g., a desktop, laptop, tablet, smart phone, etc.) or a battery. The energy transferred between the RF transmitter and the RF receiver may then be used to operate the computing device and/or to charge the battery. Hence, transfer efficiency (the amount of energy that is received relative to the amount of energy that is transmitted) is a critical parameter in wireless power transfer design.

As the inventors hereof have recognized, coils in both the RF transmitter and the RF receiver are controlled using a number of switches or transistors, and increasing the power transfer efficiency often requires precise control of those transistors. However, the high-frequency clocks that would typically be necessary to provide such control would significantly increase cost and complexity. To address these, and other concerns, the inventors have developed systems and methods for wireless power transfer with fractional timing resolution.

SUMMARY OF THE INVENTION

Embodiments of the invention provide systems and methods for wireless power transfer with fractional timing resolution. In a non-limiting, illustrative embodiments, an electrical power transmitter may include a transistor and a rising edge control circuit configured to control a gate of the transistor to produce a rising edge of a pulse at a time selected with a resolution greater than a full-clock period.

The electrical power transmitter may also comprise an inductor configured to emit power wireless over a power carrier frequency, where the full-clock period is the inverse of the power carrier frequency. The electrical power transmitter may also comprise a phased-locked loop (PLL) circuit having a voltage controlled oscillator (VCO), where the VCO is configured to produce a clock signal having a frequency n times greater than a power carrier frequency.

In some cases, the rising edge control circuit may include a divider circuit coupled to the VCO and configured to divide the clock signal into n portions. The rising edge control circuit may also include a multiplexer coupled to the VCO and configured to subdivide each of the n portions into a plurality of m sub-portions. For example, m may be a number of clock phases of the VCO. The rising edge control circuit may further comprise a delay circuit configured to apply a timing delay only to fewer than all possible m values. The resolution may be equal to the inverse of the power carrier frequency divided by a product of n times m.

In some implementations, the gate of the transistor may be controlled via a falling edge control circuit that employs the power carrier frequency to produce a falling edge of the pulse at a subsequent time selected with the resolution. The wireless power transmitter further may include a flip-flop having a set input coupled to the rising edge control circuit and a reset input coupled to the falling edge control circuit, such that an output of the flip-flop is used to produce the pulse, and where the pulse is a pulse-width modulated (PWM) pulse usable to drive the gate of the transistor.

The electrical power transmitter may also include a receiver comprising: another inductor configured to receive the wireless power; and another transistor coupled to the other inductor, where another gate of the other transistor is controlled using another rising edge control circuit and another falling edge control circuit, and where the other rising edge control circuit and the other falling edge control circuit are configured to generate, using the power carrier frequency, another pulse having the resolution. The transistor may be part of an H-bridge circuit, and the other transistor may be part of a rectifier bridge.

In another illustrative, non-limiting embodiment, a computing device may include a processor and a wireless power receiver configured to provide power to the processor, where the wireless power receiver comprises an inductor coupled to a transistor, and where a gate of the transistor is controlled, in part, via a rising edge control circuit configured to employ a power carrier frequency to produce a rising edge of a pulse at a time selected with a resolution greater than an inverse of the power carrier frequency.

The wireless power receiver may be configured to provide power to the processor by charging a battery. The transistor may be part of a rectifier circuit. And the wireless power receiver further may include a VCO of a PLL circuit, wherein the VCO is configured to receive the power carrier frequency and to produce a clock signal having n times the power carrier frequency.

The rising edge control circuit may include a divider coupled to the VCO and configured to split the clock signal into n portions; and a multiplexer coupled to the VCO and configured to subdivide each of the n portions into a plurality of m sub-portions, where m is a number of clock phases of the VCO, and where the resolution is equal to the inverse of the power carrier frequency divided by a product of n times m. The gate of the transistor may be further controlled, in part, via a falling edge control circuit configured to employ the power carrier frequency to produce a falling edge of the pulse at a subsequent time selected with the resolution, where the wireless power receiver further comprises a flip-flop having a set input coupled to the rising edge control circuit and a reset input coupled to the falling edge control circuit, and where an output of the flip-flop is usable to produce the pulse.

In yet another illustrative, non-limiting embodiment, a method may include receiving electrical power wirelessly via an inductor over a power carrier frequency, where the inductor is coupled to a rectifier having a set of transistors; generating a PWM signal using one or more selected ones of n×m subdivisions of a VCO output produced by a VCO of a PLL circuit, where the VCO is configured to receive a reference clock having the power carrier frequency and to produce the output having n times the power carrier frequency and m selectable phases; and controlling each of the set of transistors with the PWM signal. The method may also include providing the power to a battery or computing device.

BRIEF DESCRIPTION OF THE DRAWINGS

Figure 1:
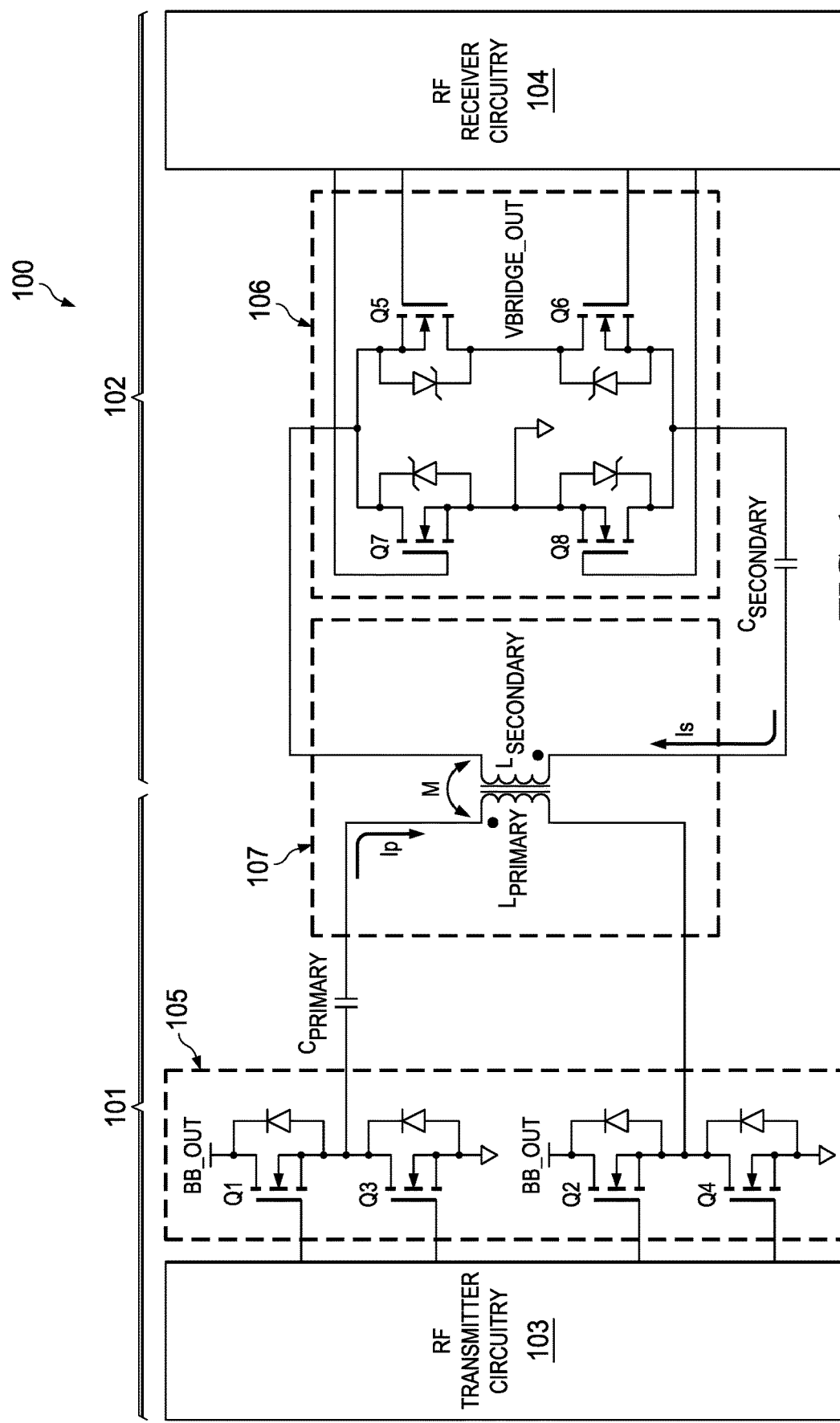

Having thus described the invention in general terms, reference will now be made to the accompanying drawings, wherein:

FIG. 1 is a block diagram of an example of a wireless power transmission system according to some embodiments.

Figure 2:
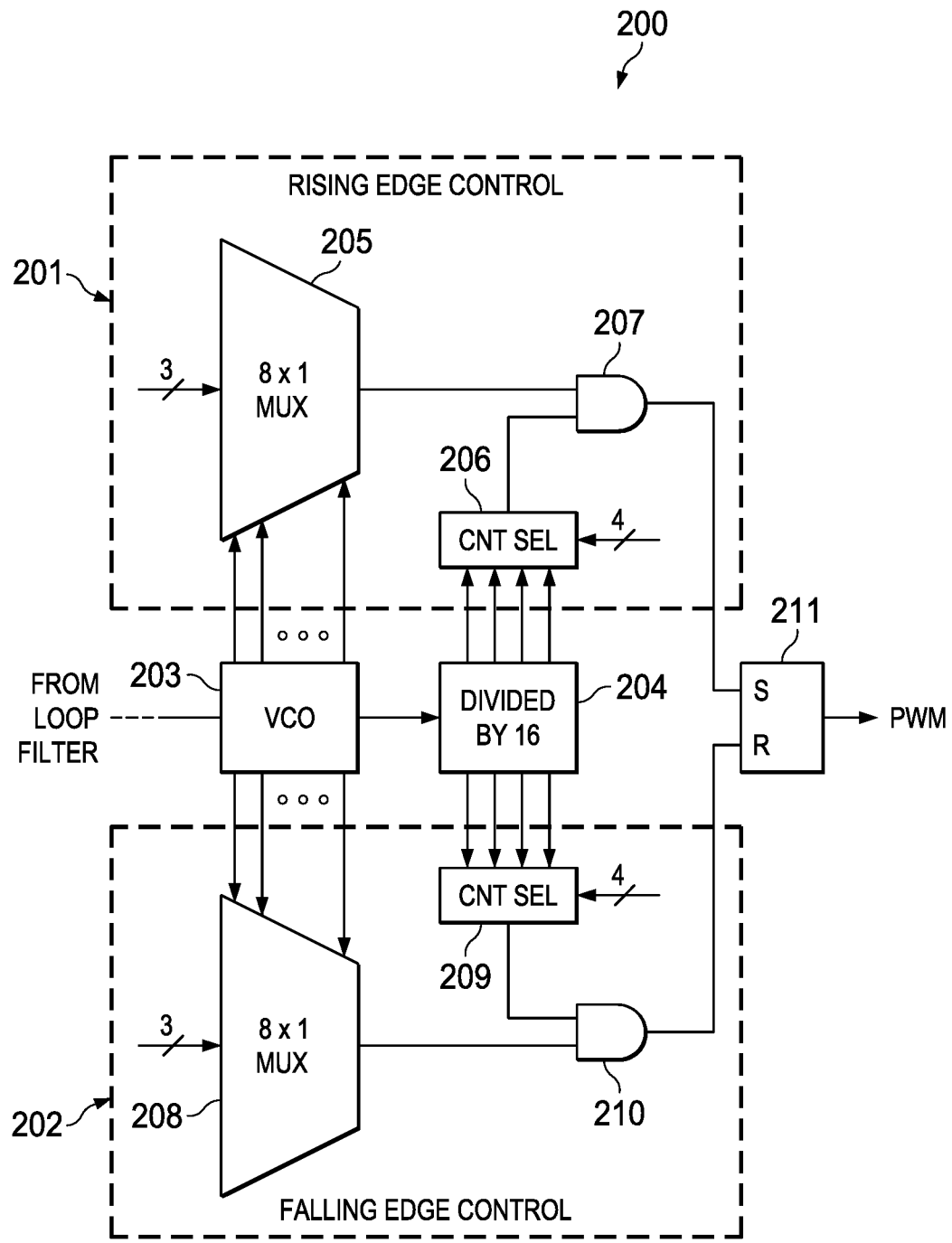

FIG. 2 is a block diagram of an example of a Phased-Locked Loop (PLL)-based Pulse-Width Modulation (PWM) generator with fractional period timing resolution according to some embodiments.

Figure 3:
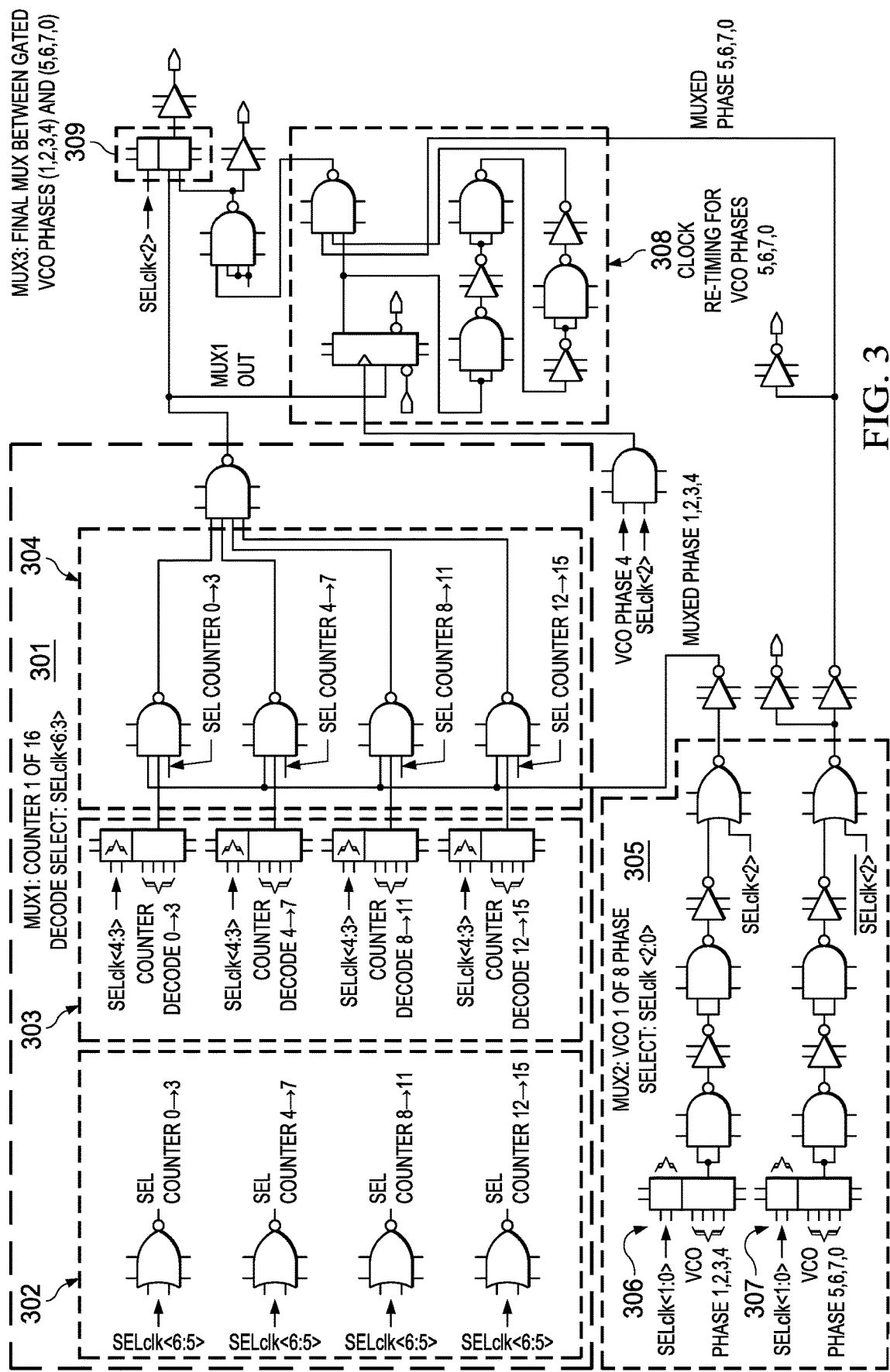

FIG. 3 is a circuit diagram of an example implementation of the PLL-based PWM generator with fractional period timing resolution according to some embodiments.

Figure 4:
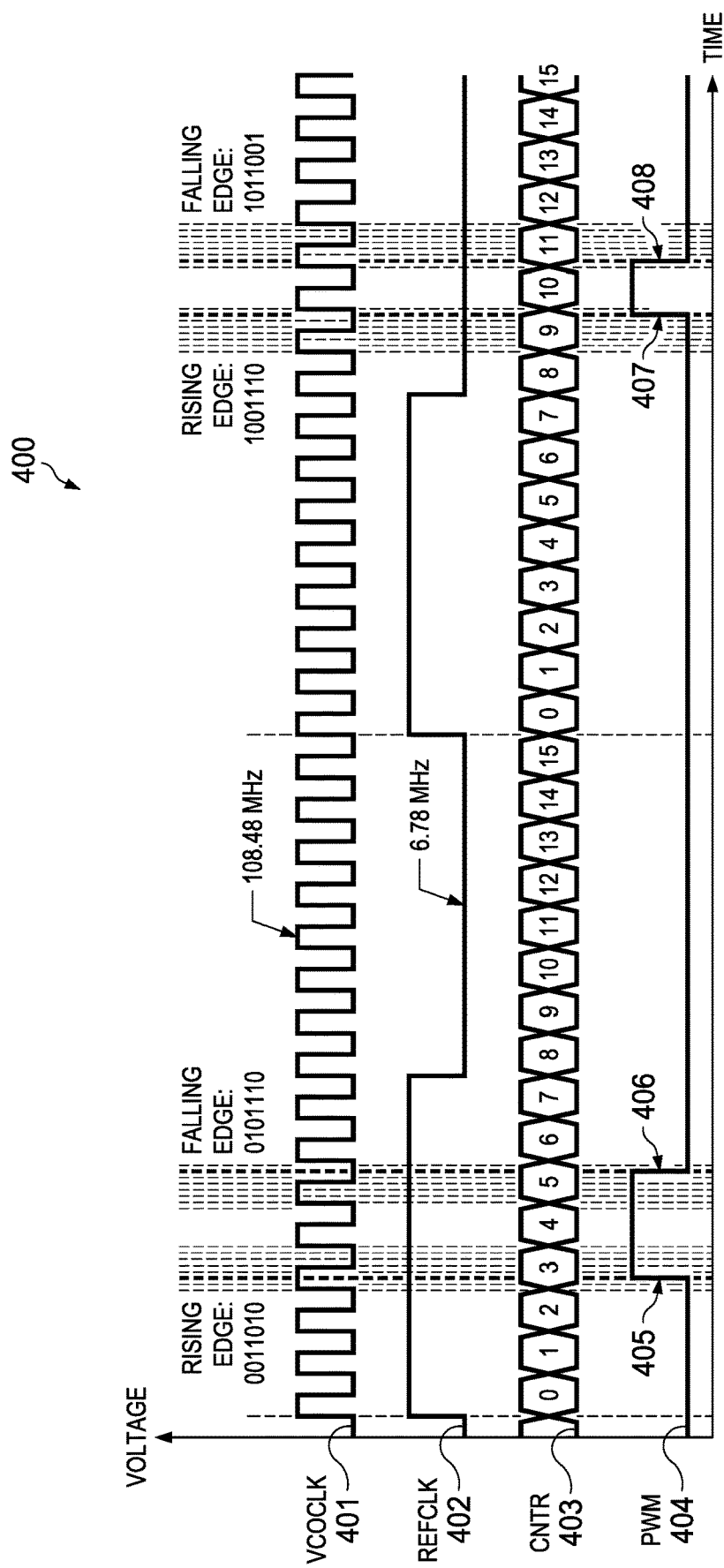

FIG. 4 is a chart illustrating the operation of a PLL-based PWM generator with fractional period timing resolution according to some embodiments.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

FIG. 1 is a block diagram of an example of wireless power transmission system 100 according to some embodiments. As shown, wireless power transmission system 100 includes radio frequency (RF) transmitter 101 and RF receiver 102.

RF transmitter 101 includes RF transmitter circuitry 103 and H-bridge 105 having a plurality of transistors or switches Q1-Q4. As used herein, the term "H-bridge" refers to an electronic circuit that enables a voltage to be applied across a load in either direction. In various embodiments, transistors Q1-Q4 may each have a diode between source and drain terminals. For example, Q1-Q4 may be implemented as power metal-oxide-semiconductor field-effect transistors (MOSFETs) or the like.

RF transmitter 101 also includes primary smoothing capacitance ($C_{primary}$) and primary inductor, coil, or antenna ($L_{primary}$) coupled to H-bridge 105. When $L_{primary}$ is electromagnetically coupled to a secondary inductor, coil, or antenna ($L_{secondary}$), it forms electrical transformer 107.

RF receiver 102 includes $L_{secondary}$ and secondary smoothing capacitance ($C_{secondary}$) coupled to rectifier bridge 106. Rectifier bridge 106 includes a plurality of transistors or switches Q5-Q8 (e.g., power MOSFETs) coupled to RF receiver circuitry 104. The node between Q5 and Q6 provides an output voltage rail ($V_{bridge\_out}$). $V_{bridge\_out}$ is then provided to a buck-boost converter, voltage regulator, or the like (not shown), in order to power an electrical load, such as a battery or processor of a computing device.

Electrical transformer 107 enables primary electric current $I_p$ to be converted into electromagnetic field M, which is then emitted by $L_{primary}$ as a power carrier signal having a power carrier frequency. In turn, $L_{secondary}$ receives a portion of the electromagnetic energy and converts it into secondary electric current $I_s$.

The efficiency of the power transfer between RF transmitter 101 and RF receiver 102 is given by the ratio between energy transmitted and energy received, which is proportional to the ratio between electrical currents $I_s$ and $I_p$. Moreover, this efficiency is largely dependent upon the speed and precision with which transistors Q1-Q8 can be turned on (conductive) and off (non-conductive save for leakage effects), in order to generate $I_p$ and $I_s$.

Broadly, transistors Q1-Q8 are controlled by RF transmitter circuitry 103 and RF receiver circuitry 104, which apply pulse signals to the gate terminals of their respective transistors. In various embodiments, RF transmitter circuitry 103 and RF receiver circuitry 104 may produce Pulse-Width Modulated (PWM) pulses having a timing resolution or granularity selected based upon a fractional division of a clock signal. For example, such a clock signal may the same frequency over which power is wirelessly radiated (power carrier frequency).

To illustrate the foregoing, assume that the power carrier frequency is over several Megahertz, such as, for example, 6.78 MHz. In this case, the resolution or granularity for the gate driver pulses (on/off) should be in the 1.1 ns range. Given this requirement, a system clock of 870 MHz would ordinarily be needed as a time basis for generating these pulses. However, operating at this high clock frequency would significantly increase the implementation cost and complexity of the final solution. A major cost adder is the fact that the required process and technology for implementing such a system needs to concurrently support both high voltage and high speed operation. This is usually not easy to achieve at an acceptable cost. In addition, the resulting high power consumption is another factor which renders conventional implementations uncompetitive.

Accordingly, in various embodiments, fractional division of the clock signal may be achieved with a phase-locked loop (PPL) circuit coupled to one or more gate control circuits, as depicted in FIG. 2. Particularly, FIG. 2 is a block diagram of PLL-based PWM pulse generator with fractional period timing resolution 200. In various embodiments, one or more instances of generator 200 may be deployed in RF transmitter circuitry 103 and/or RF receiver circuitry 104.

As shown, Voltage Controlled Oscillator (VCO) 203 receives, from a PLL filter (not shown), a signal locked to the power carrier frequency (e.g., running 6.78 MHz). In response, VCO 203 produces a clock having a frequency n times greater the power carrier frequency (e.g., if n=16, then the output clock frequency of VCO 203 is 108.48 MHz). In some implementations, VCO 203 may be an m-stage fully differential ring oscillator (e.g., an 8-stage oscillator running at 108.48 MHz).

The output of VCO 203 is provided to divider circuit 204 (in this case, divides the clock period in 16 parts or "bins." Rising edge control circuit 201 includes first multiplexer 205 configured to receive one of the m phases of VCO 203, and to select one value of m (e.g., based upon a 3-bit LSB portion of a control word). Counter selection circuit 206 selects one of the n bins from divider 204 (e.g., based upon a 4-bit MSB portion of the control word). The outputs from multiplexer 205 and counter selection circuit 206 are combined by logic gate 207 to select a rise time for a PWM pulse with a time resolution or granularity (and/or in discrete time increments) equal to the period of the power carrier frequency divided by the product of n×m.

Particularly, in the case where the frequency 6.78 MHz, the period of the power carrier signal is ~147 ns; yet when n=16 and m=8, the timing resolution for the selected rise time is in the order of 1.15 ns.

Still referring to FIG. 2, falling edge control circuit 202 is similar to rising edge control circuit 201, in that multiplexer 208 may be another instance of the same device as multiplexer 205, and counter selection circuit 209 may be another instance of the same device as counter selection circuit 206.

The output of logic gate 207 is coupled to the set input of flip-flop 211, and the output of logic gate 210 is coupled to the reset input of flip-flop 211. As such, the resulting PWM pulse at the output of flip-flop 211 is produced with rising and falling edges selected with the aforementioned increased timing granularity or resolution.

PLL-based PWM pulse generator 200 is capable of sub-nanosecond PWM pulse fidelity while running only at a 108.48 MHz system clock speed (from VCO 203). Fractional timing resolution may be achieved by tapping intermediate stages within an 8-stage ring oscillator. An all-digital gate-pulse encoder combines the ring oscillator clock phases with state information coming from the PLL feedback divider resulting in a high fidelity, extremely flexible PWM pulse generator.

The result is a PWM generation scheme with a 1.15 ns resolution for both pulse width and location. Thus, the PWM pulses driving the gates of NexFet devices Q1-Q8 (on both transmitter and synchronous receiver/rectifier) are able to start anywhere and stop anywhere within a 1/6.78 MHz (~147 ns) reference clock cycle.

On the transmitter side, VCO 203 is part of a PLL frequency synthesizer locked to an external reference clock running at 6.78 MHz. The receiver side may use all of the same circuitry except that the 6.78 MHz received carrier signal serves as the PLL reference.

In some implementations, the circuit may yield the rising edge of the PWM pulse any start time (e.g., always at t=150 ns), while the falling edge may be selected at any discrete time from t=150 ns+1.15 ns to t=150 ns+1.15 ns×124=292 ns. The pulse width of each of pulse may be controlled as the select of the decoder controlling the falling edge varies between 1 and 124 (7 bits of resolution).

For example, eight clock phases out of an 8-stage VCO ring oscillator may be combined with a 16 feedback divider (divide by 16) tap to generate PWM control pulses for all 4 gate/FET drivers on both transmitter (primary) and receiver (secondary) sides. That is, the 147 ns (1/6.78 Mhz) reference clock cycle gets divided into 128 slots, each slot being 1.15 ns wide. Finally, the rising edge control output sets the SR FF (which starts the PWM pulse), whereas the falling edge control output resets the SR FF (which ends the PWM pulse).

Depending upon the speed limitations of the choice of process node, PWM width of 125-128 may not be coverable with circuit 200; but that is not necessary for this application. Yet, in other embodiments, the entire PWM width range may be covered.

FIG. 3 is a circuit diagram of implementation example 300 of PLL-based PWM generator with fractional period timing resolution 200 according to some embodiments. Here, multiplexer circuit 301 (MUX1) may implement counter selectors 206 and/or 209, and multiplexer circuit 305 may implement multiplexers 205 and/or 208. Implementation example 300 also includes timing circuit 308 configured to operate upon a subset of phases selected via multiplexer 305 prior to being combined with the output of multiplexer circuit 301 via multiplexer 209 and in order to select a particular time for a rising or falling edge of the ultimate PWM pulse.

Multiplexer circuit 301 includes a first set of logic gates 302 configured to select a first subset of the 16 bins (referred to as bins 0 through 15) resulting from operation of divider 204 using a two-bit portion of a 7-bit control word (e.g., bits 5 and 6). Here, each of the subsets of bins has 4 coarse subdivisions: SEL counters=0→3, 4→7, 8→11, or 12→15.

Multiplexer circuit 301 also includes a second set of logic gates 303 or multiplexers configured to select, within each of the subset of bins, a particular one of those bins using another two-bit portion of the 7-bit control word (e.g., bits 3 and 4). Here, COUNTER decode inputs are again dispersed into different groups: COUNTER decode=0→3, 4→7, 8→11, or 12→15, each COUNTER decode input selecting an individual bin within that subset of bins (finer or more precise selection). Finally, the output of logic gates 302 and 303 are combined by logic gates 304 to select a specific one of the 16 bins by outputting a selected value of m.

Multiplexer circuit 305 includes multiplexer 306 and multiplexer 307. Multiplexer 306 is operable to select one of phases 1, 2, 3, or 4 of VCO 203, and multiplexer 307 is operable to select one of phases 5, 6, 7, or 0. When either multiplexer 306 or 307 selects a phase, the value of n is set and multiplexer 309 issues a rising or falling edge at a time selected with increased resolution (e.g., 1.15 ns). In some cases, timing circuit 308 may be used to adjust the timing of certain phase selections at the output of multiplexer 307 to avoid leakage effects or the like.

As such, multiplexer circuit 301 selects which one of the 16, CNTR feedback divider phases is used. All the CNTR phases come off the same tap of the VCO, namely VCO PHASE 0. Also, multiplexer circuit 301 gates the VCO phases 1, 2, 3, 4, which at this point can be directly ANDed with whichever COUNTER state is selected, given that the CNTR changes state on Phase 0. Meanwhile, multiplexer circuit 305 has 2 outputs: a first one is the MUXed phases 1, 2, 3, 4, which gets ANDed directly. The second output is the MUXed phases 5, 6, 7, 0, which take another route through clock re-timing circuit 308 in order to not create an unwanted double edge when the COUNTER selected state (clocked by VCO Phase 0) gets ANDed with the MUXed Phase 5, 6, 7, 0.

In some cases, clock re-timing circuit 308 may use the VCO phase 4 to resample the output and re-time it for subsequent VCO phases 5, 6, 7, 0. Again, this ensures that when VCO phases 5, 6, 7, 0 get ANDed-inside the clock re-timing circuit 308—with the selected and re-timed CNTR state, there is no double clock occurring. Finally, multiplexer 309 selects (based on SELclk<2>) which VCO Phase bank (1, 2, 3, 4 or 5, 6, 7, 0) goes to the final output.

FIG. 4 shows chart 400 illustrating the operation of PLL-based PWM generator with fractional period timing resolution 200 according to some embodiments. VCOCLK signal 401 is the clock signal output by VCO 203, which has 16× the power carrier frequency, shown as REFCLK signal 402 (e.g., 108.48 and 6.78 MHz, respectively). The output of counter selector(s) 403 are bins 0-16 shown in gated curve 403.

Assume that, in this case, the control word is a 7-bit word divided into two groups: the four upper bits or MSBs and the three lower bits or LSBs. The first group encodes a selected value for n (bin number 0→15) and the second portion encodes a selected value for m (phase 0→7). Moreover, the first group is further subdivided into two parts: a first, 2-bit part that indicates a subset of bins, and a second, 2-bit part that indicates an individual bin within the sub set.

In this example, a first pulse has a rising edge 405 given by control word 0011010, in binary form. In sequential order from left to right, in the 4 MSBs, "00" indicates one of the four subset of bins (e.g., one of bins 0-4, in this case bin 0), and "01" pinpoints the third bin within that subset (in this case, bin 3). Moreover, in the 3 LSBs, "010" indicates the intra-bin subdivision (m=2).

The pulse then has a falling edge 406 selected by control word 0101110 which, precisely places it at the $6^{th}$ intra-bin subdivision (m=6) of bin 5 (n=5). Thus, using the granularity afforded by systems and methods described herein, rising edge 405 may be placed at a precisely desired rise time.

At a later time, a subsequence pulse has a rising edge 407 and falling edge 408 selected by control words 1001110 and 1011001, respectively. Using systems and methods described herein, rising edge 405 is placed at the 6th intra-bin subdivision (m=6) of bin 9 (n=9), and falling edge 408 is placed at the first intra-bin subdivision (m=1) of bin 11 (n=11).

In contrast with systems and methods described herein, conventional solutions to the foregoing problems fall in one of two categories: first, there are digital PWM generators that invariably rely on a PLL/DLL type implementation with synchronous PWM generation. These implementations require a system clock running at the rate proportional to the required PWM resolution (870 MHZ, for example, for a ~1.15 ns timing resolution). Moreover, these implementations suffer from high implementation cost, high power consumption and increased complexity.

Second, there are analog implementations rely on the counter, digital-to-analog converter (DAC), and comparator schemes to generate PWM pulses. However, these analog techniques suffer from limitations typically associated with analog circuits, such as poor component matching, drift over temperature, variation over process, higher power, potential instability, and/or reduced scalability.

Also, compared to full-clocked-based designs (that is, where the VCO runs at 1/1.15 ns=870 Mhz), systems and methods described herein may provide a number of features, including, for example, allowing cheaper and/or older technologies to employ high-voltage capabilities needed to drive the external NexFet devices. These systems and methods also use much less power given that the maximum frequency of operation is only ⅛ of the full-clock-based design (RMS power is proportional to the operating frequency).

Compared with traditional analog PWM generation schemes, the proposed PWM generator provides superior performance without the need for background calibration or trimming. An all-digital implementation results in improved part-to-part matching, as well as consistent and repeatable performance across wide operating temperature ranges. These systems and methods are flexible and scalable to any desirable PWM and/or reference frequency.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. An electrical power transmitter, comprising:
   a primary inductor;
   a drive transistor coupled to the primary inductor, the transistor having a gate; and
   a rising edge control circuit including:
      a voltage controlled oscillator (VCO) having a power carrier frequency input, having m stage outputs, and having a clock signal output;
      a rising edge multiplexer having m sub-portion inputs coupled to the m stage outputs, a select input, and a rising edge multiplexer output;
      a rising edge divider circuit having an input coupled to the clock signal output and having n rising edge portion outputs; and
      rising edge logic circuitry having inputs coupled to the rising edge multiplexer output and the n rising edge portion outputs, and having a rising edge control output coupled to the drive transistor gate.

2. The electrical power transmitter of claim 1, in which m is a number of clock phases of the VCO.

3. The electrical power transmitter of claim 2, in which the rising edge control circuit includes a delay circuit configured to apply a timing delay only to fewer than all possible m values.

4. The electrical power transmitter of claim 1, in which the control output provides a signal having a resolution that is equal to the inverse of the power carrier frequency divided by a product of n times m.

5. The electrical power transmitter of claim 1, including a falling edge control circuit, the falling edge control circuit including:
   a falling edge multiplexer having m sub-portion inputs coupled to the m stage outputs, a select input, and a falling edge multiplexer output;
   a falling edge divider circuit having an input coupled to the clock signal output and having n falling edge portion outputs; and
   falling edge logic circuitry having inputs coupled to the falling edge multiplexer output and the n falling edge portion outputs, and having a falling control output coupled to the transistor gate.

6. The electrical power transmitter of claim 5, including a flip-flop having a set input coupled to the rising edge control output and a reset input coupled to the falling edge control output, and a pulse width output of the flip-flop coupled to the gate of the drive transistor.

7. The electrical power transmitter of claim 1, including:
   a receiver, including:
   a secondary inductor coupled to the primary inductor; and
   a rectifier transistor coupled to the secondary inductor, in which a gate of the rectifier transistor is coupled to an output of a receiving rising edge control circuit and to an output of a receiving falling edge control circuit.

8. The electrical power transmitter of claim 7, in which the drive transistor is part of an H-bridge circuit, and in which the rectifier transistor is part of a rectifier bridge.

9. A computing device, comprising:
   a processor having power leads; and
   a wireless power receiver having power outputs coupled to the power leads of the processor, the wireless power receiver including a secondary inductor coupled to a rectifier transistor, the rectifier transistor having a gate and the wireless power receiver including a rising edge control circuit including:
      a voltage controlled oscillator (VCO) having a power carrier frequency input, having m stage outputs, and having an clock signal output;
      a rising edge multiplexer having m sub-portion inputs coupled to the m stage outputs, a select input, and a rising edge multiplexer output;
      a rising edge divider circuit having an input coupled to the clock signal output and having n rising edge portion outputs; and
      rising edge logic circuitry having inputs coupled to the rising edge multiplexer output and the n rising edge portion outputs, and having a rising edge control output coupled to the rectifier transistor gate.

10. The computing device of claim 9, in which the power outputs are coupled to a battery.

11. The computing device of claim 9, in which the rectifier transistor is part of a rectifier circuit.

12. The computing device of claim 9, in which the wireless power receiver includes:
- a falling edge control circuit having a falling edge control output; and
- a flip flop having a set input coupled to the rising edge control output, a reset input coupled to the falling edge control output, and a pulse output coupled to the gate of the rectifier transistor.

13. A method, comprising:
- receiving electrical power wirelessly via a secondary inductor at a power carrier frequency, in which the secondary inductor is coupled to a rectifier having a set of transistors;
- generating a Pulse-Width Modulated (PWM) signal using one or more selected ones of n×m subdivisions of a Voltage Controller Oscillator (VCO) output, in which the VCO is configured to receive a reference clock having the power carrier frequency and to produce the output having n times the power carrier frequency and m selectable phases; and
- controlling the set of transistors with the PWM signal.

14. The method of claim 13, including providing the power to a battery or computing device.

* * * * *